(12) United States Patent
Gillissen et al.

(10) Patent No.: US 7,479,653 B2
(45) Date of Patent: Jan. 20, 2009

(54) UV CURABLE PROTECTIVE ENCAPSULANT

(75) Inventors: Stijn Gillissen, Hasselt (BE); Grete Van Wuytswinkel, Lummen (BE)

(73) Assignee: Henkel AG & Co KgaA (DE)

( * ) Notice: Subject to any disclaimer, the term of this patent is extended or adjusted under 35 U.S.C. 154(b) by 827 days.

(21) Appl. No.: 10/727,951

(22) Filed: Dec. 4, 2003

(65) Prior Publication Data

US 2005/0121665 A1 Jun. 9, 2005

(51) Int. Cl.
*B05D 5/12* (2006.01)
*H01L 35/24* (2006.01)

(52) U.S. Cl. .................. 257/40; 427/96.2; 524/559

(58) Field of Classification Search .......... 257/40; 427/96.2; 524/559
See application file for complete search history.

(56) References Cited

U.S. PATENT DOCUMENTS

| | | | |
|---|---|---|---|
| 3,896,014 A | 7/1975 | Rosenberg | |
| 4,073,835 A | 2/1978 | Otsuki et al. | |
| 4,203,792 A | 5/1980 | Thompson | |
| 4,336,311 A | 6/1982 | Lucey | |
| 4,349,605 A | 9/1982 | Biggs et al. | |
| 4,390,401 A | 6/1983 | Costanza | |
| 4,407,984 A | 10/1983 | Ratcliffe et al. | |
| 4,635,356 A | 1/1987 | Ohuchi et al. | |
| 4,843,036 A | 6/1989 | Schmidt et al. | |
| 4,880,662 A | 11/1989 | Habrich et al. | |
| 5,085,924 A | 2/1992 | Eckberg | |
| 5,098,766 A * | 3/1992 | Gelorme et al. | 428/138 |
| 5,134,175 A | 7/1992 | Lucey | |
| 5,180,757 A | 1/1993 | Lucey | |
| 5,543,246 A | 8/1996 | Treger | |
| 6,034,441 A | 3/2000 | Chen | |
| 6,040,044 A | 3/2000 | Takahashi et al. | |
| 6,553,169 B2 * | 4/2003 | Fabian | 385/128 |
| 6,762,249 B1 * | 7/2004 | Fujinawa et al. | 525/455 |
| 6,775,451 B1 * | 8/2004 | Botelho et al. | 385/128 |
| 2002/0098626 A1 | 7/2002 | Blalock | |

FOREIGN PATENT DOCUMENTS

| | | |
|---|---|---|
| CH | 665060 | 4/1988 |
| CH | 684528 | 10/1994 |
| DE | 4017941 | 12/1991 |
| DE | 4434382 | 3/1996 |
| DE | 4435120 | 4/1996 |
| DE | 10054873 | 5/2002 |
| EP | 0 372 556 | 12/1989 |
| EP | 0 384 616 | 8/1990 |
| EP | 0717370 | 6/1996 |
| EP | 0 518 142 | 10/1996 |
| EP | 0 474194 | 1/1997 |
| GB | 2 261 548 | 5/1993 |
| JP | 59168033 | 9/1984 |
| WO | WO 8900337 | 1/1989 |
| WO | WO 97/22637 | 6/1997 |

* cited by examiner

*Primary Examiner*—Robert D. Harlan
(74) *Attorney, Agent, or Firm*—Sun Hee Lehmann

(57) ABSTRACT

The present invention discloses encapsulant materials for use in glob top and/or dam and fill applications comprising base oligomer/monomers preferably having an acrylated/methacrylated or vinylene-containing oligomer/polymer, one or more multifunctional acrylate monomers, one or more thixotropic agents and, optionally, fillers, additives, photoinitiators and/or pigments. The encapsulant has low levels of water absorption and shrinkage.

14 Claims, No Drawings

UV CURABLE PROTECTIVE ENCAPSULANT

FIELD OF THE INVENTION

The present invention relates to UV and/or thermally curable encapsulants that are utilized to protect electronic components, such as semiconductor devices.

BACKGROUND OF THE INVENTION

Encapsulation materials have been utilized for many years to protect electronic components from mechanical stresses, humidity and other potentially threatening conditions. Such encapsulants are commonly used in electronic devices containing silicon chips, boards, and connection wires. The encapsulant is usually applied to the component in a fluid state and cured via exposure to ultraviolet or visible light, and/or by heating.

Two methods of deposition of the encapsulation material are commonly utilized. The first method is the glob top method in which the encapsulant is deposited directly on top of the electronic component and allowed to cure such that the entire component is protected. The second method is the dam and fill method. In the dam and fill method a more thixotropic material (the dam material) is deposited around the perimeter of an electronic component to be protected to create a barrier. The dam material remains immobile after deposition. A less thixotropic, more liquid material (the fill material) is placed over the electronic component within the barrier created by the dam material. The fill material preferably has a very high flow so that it can protect dies with very small pitch sizes. Both the dam and fill material may be cured via exposure to ultraviolet or visible light, through heating, or by a combination of any of these methods. Despite the desired differences in properties, currently commercially available encapsulants provide similar formulations for both the dam and fill material.

Several properties are particular important in providing an encapsulant material. Foremost, it is useful that the encapsulant have a high Tg. The thermal expansion of acrylates, epoxies and other resin systems is greatly increased at temperatures above the Tg. The thermal expansion is relatively low at temperatures under the Tg. High thermal expansion results in part failure during temperature cycling. In addition, it is important that the encapsulant not be tacky after curing. Further, as shrinkage causes stress after cure, it is desirable that the encapsulant has minimal shrinkage during cure. Finally, the rheology of the encapsulant should be such that the encapsulant is easily dispensed and stable for as long a time as possible, preferably at least six months.

It would be advantageous to provide encapsulant materials having the properties set forth above for both the dam and the fill components of the encapsulant. These materials would have the different properties desired for each specific application.

SUMMARY OF THE INVENTION

The present invention discloses encapsulant materials for electronic components for use in glob top and/or dam and fill applications comprising base oligomer/monomers preferably having an acrylated/methacrylated or vinylene-containing oligomer/polymer, one or more multifunctional acrylate monomers, one or more thixotropic agents and, optionally, fillers, additives, photoinitiators and/or pigments. For a UV curable material, the encapsulant has low levels of water absorption and shrinkage.

DETAILED DESCRIPTION OF THE PREFERRED EMBODIMENTS

The encapsulant of the present invention may be tailored for the desired purpose, i.e., the formulations may differ between encapsulants intended for use as dam, fill or glob top encapsulation of electronic components. Generally, the encapsulant comprises (meth)acrylate or vinylene monomers and oligomers/polymers. The base oligomer(s)/polymers preferably comprise an acrylated/methacrylated or vinylene-containing oligomer/polymer. The functional groups are reactive in free radical polymerization reactions which allows the incorporation of the oligomer/polymer.

One method to increase the Tg of the encapsulant is by the addition of one or more multifunctional acrylate monomers. This property is especially useful in encapsulant to be used in a fill application. The monomers should be multifunctional (meth)acrylate or vinylene monomers which possess a cyclic structure between the reactive groups. Various di-, tri-, tetra-, and penta-acrylate monomers may be utilized, however while many of these monomers increase the Tg they also result in increased shrinkage. The preferred diacrylate is tricyclodecane dimethanol diacrylate (TCDDMDA), commercially available as SR-833S from Sartomer. Other diacrylates that may be utilized to provide an encapsulant with high Tg and low shrinkage include dicyclopentenyl acrylate (Bimax), dicyclopentenyl methacrylate (Bimax), and hydroxypivalaldehyde modified trimethylolpropane diacrylate (Sartomer).

While various (meth)acrylate or vinylene-containing oligomer/polymers may be utilized as the base oligomer, it is preferred to utilize a urethane acrylate as the base oligomer. One such urethane acrylate is EBECRYL 8800, commercially available from UCB. The use of this urethane acrylate eliminates the tackiness of the encapsulant. Also preferred is polybutadiene, a styrene-butadiene copolymer, a styrene-isopropene copolymer, or an acrylate polymer in situations in which it is desired that the encapsulant have a high hydrophobicity.

The composition utilizes a thixotropic agent in order to control the thixotropicity necessary for the desired application. To this end it has been discovered that the use of treated fumed silica as a thixotropic agent in place of untreated silica produces a composition with a more stable rheology. Preferably, the thixotropic agents are hydrophobic fumed silicas, wherein the hydroxyl groups at the silica surface are replaced with silyl groups. Commercial hydrophobic fumed silicas include Cab-O-Syl (Cabot) in which the silica is treated with a dimethyl silicone fluid. The treated fumed silica produces exceptional stability in the encapsulation composition for both dam and fill applications. The exceptional stability results in easy and consistent dispensing of the encapsulant.

Filler materials may be utilized to reduce the thermal expansion coefficient of the composition. Generally, fillers have a low thermal expansion and can lower the overall thermal expansion of the product if introduced in sufficient amounts. Among the fillers that may be utilized are spherical hollow glass beads, solid glass beads, talc and spherical silica and mixtures thereof. A coupling agent, preferably a silane type agent, may be added to improve the incorporation of the filler into the polymer matrix. In order to reduce the thermal expansion to its minimum, the filler may be added in concentrations in the range of about 40 to about 80 weight percent. The fillers are preferably only added to the composition intended for application as fill. The dam material usually does not come into direct contact with the die or wires, thus reducing thermal expansion is not critical for dam material.

In order to produce an UV curable composition, photoinitiators must be added. Among the commercially available photoinitiators that may be included in the composition are IRGACURE 819 and IRGACURE 651 (Ciba). If desired, thermal curing agents may be added in addition to or instead of the photoinitiators. Pigments may be added as desired. Among the commercially available pigments that may be included in the composition are Violet BLP, commercially available from Clariant. Compositions containing high pigment loadings can still be cured by UV radiation to a depth of at least 1 mm. Additional ingredients, including adhesion promoters, coupling agents, and other materials, may be added as desired.

The encapsulant comprises in the range of about 1 to about 75, and preferably about 20 to about 50, weight percent of the base oligomer, which comprises about 1 to about 75, and preferably about 10 to about 30 weight percent of acrylate, about 1 to about 50, and preferably about 10 to about 20 weight percent of methacrylate. The encapsulant also comprises about 1 to about 50, and preferably about 10 to about 30 weight percent of a multifunctional acrylate monomer. In addition, the encapsulant preferably includes about 0.1 to about 4, and preferably about 1 to about 2 weight percent photoinitiator and about 0.1 to about 8 and preferably about 2 to about 5 weight percent of a thixotropic agent. Preferably, a filler is included in the composition in the range of about 1 to about 85, and preferably about 50 to about 75 weight percent.

The invention may be better understood by reference to the following non-limiting examples.

EXAMPLE

Commercially available dam and fill encapsulant compositions were compared with dam and fill compositions according to the present invention. The commercially available (control) compositions have similar ingredients to those of the new compositions, however the control compositions contain treated silica and the control fill composition does not contain a diacrylate. The new formulations are shown in Tables 1 and 2.

TABLE 1

Dam Encapsulant Composition

| Ingredient | A |
|---|---|
| Urethane Acrylate[1] | 48.2 |
| Isobornylacrylate | 19.3 |
| NNDMA | 18.3 |
| Photoinitiators | 5.8 |
| Adhesion Additives | 3.4 |
| Treated Silica[2] | 5 |

[1]CN-965, commercially available from Sartomer
[2]Cab-O-Syl TS 720, commercially available from Cabot

TABLE 2

Fill Encapsulant Composition

| Ingredient | B |
|---|---|
| Urethane Acrylate | 28[1] |
| Isobornylacrylate | 27 |
| NNDMA | 19.5 |
| Photoinitiators | 3.5 |
| Adhesion Additives | — |
| Untreated Silica | — |
| Treated Silica | 2 |
| Tricyclodecane Dimethanol Diacrylate[2] | 20 |

[1]Ebecryl 8800, commercially available from UCB
[2]SR-833S, commercially available from Sartomer The difference in stability between the new dam encapsulant formulation and the control formulation is illustrated in Table 3.

TABLE 3

Dam Encapsulant Stability

| Time (Days) | Property | Control | A |
|---|---|---|---|
| 0 | Viscosity (15 s$^{-1}$; Pa · s) | 12.1 | 10.6 |
| 15 | Viscosity | 7.8 | 9.8 |
|  | % Difference | −35.5% | −7.5% |
| 32 (30 for A) | Viscosity | 8.4 | 10.63 |
|  | % Difference | −30.6% | 0.4% |
| 66 (61 for A) | Viscosity | 7.6 | 10.35 |
|  | % Difference | −37.2% | −2.3% |

As shown in Table 3, the encapsulant material having the treated silica produced superior stability results over the material having the untreated silica.

A comparison of the properties of the encapsulant composition of the invention against the prior encapsulant utilized for fill applications are illustrated in Table 4.

TABLE 4

Fill Encapsulant Properties.

| Property | Control | B |
|---|---|---|
| Tg (° C. by DMA) | 60-70 | 110-135 |
| Shrinkage (Volume %) | 7.5-8.5 | 7.5-8.5 |
| Water Absorption (%, 24 h water) | 2.5-3 | 0.7-0.9 |
| Shelf Life | 1 month | >6 months |
| Tackfree Curing (UVA Radiation) | No | Yes |

A shown in Table 4, the fill formulation containing the TCD-DMA produces a higher Tg and substantially reduced the water absorption. In addition, the shelf life is greatly increased and tackfree UVA curing is provided.

A separate encapsulant formulation C was provided containing about 72 weight % filler (spherical solid glass beads). The results of testing on the filled encapsulant material are shown in Table 5.

TABLE 5

Filled Fill Material Properties

| Property | B | C |
|---|---|---|
| Weight % Filler | 0 | 72.7 |
| Viscosity (Pa · s; 1.5 s$^{-1}$) | 1.9 | 32.34 |
| Viscosity (Pa · s; 15 s$^{-1}$) | 0.47 | 12.79 |
| Thixotropic Index | 4.02 | 2.53 |

TABLE 5-continued

Filled Fill Material Properties

| Property | B | C |
| --- | --- | --- |
| CTE (ppm/K; −80/+10° C.)[1] | 45 | 12.5 |
| CTE (ppm/K; +120/+180° C.)[1] | 198 | 75.5 |
| Tg (DMA; tang delta; ° C.) | 113 | 122 |
| Onset Modulus Decrease (° C.) | 87 | 89 |
| Storage Modulus At 40° C. | 2570 | 6674 |
| Storage Modulus At 50° C. | 2380 | 6379 |
| Storage Modulus At 80° C. | 1383 | 4737 |
| Storage Modulus At 100° C. | 371 | 2743 |
| Storage Modulus At 120° C. | 32 | 644 |
| Hardness (Shore D) | 88 | 93 |
| Volume Shrinkage (%) | 8.15 | 5 |
| H$_2$O Absorption (24 h @RT) | 0.82 | 0.45 |
| TLSS (Mpa; PC/PC) | 3.9 | 3 |

As illustrated in Table 5 the filled encapsulant material has a higher storage modulus and is harder than the unfilled material. Most advantageously, the filler provides a significant decrease in the thermal expansion, a reduction in the volume shrinkage and reduced water absorption.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. An encapsulation composition comprising one or more base oligomer/polymers; one or more diacrylate monomers selected from the group consisting of tricyclodecane dimethanol diacrylate, hydroxypivalaldehyde modified trimethyloipropane diacrylate and mixtures thereof; one or more thixotropic agents; and one or more filler materials selected from the group consisting of spherical hollow glass beads, solid glass beads, talc, spherical silica and mixtures thereof.

2. The encapsulation composition of claim 1, wherein the diacrylate monomer is tricyclodecane dimethanol diacrylate.

3. The encapsulation composition of claim 1, wherein the one or more base oligomer/polymers is an acrylated/methacrylated or vinylene-containing oligomer/polymer.

4. The encapsulation composition of claim 1, wherein the thixotropic agent is treated silica.

5. The encapsulation composition of claim 1, further comprising a silane coupling agent.

6. The encapsulation composition of claim 1, wherein the one or more base oligomer/polymers comprises in the range of about 1 to about 75 weight percent of the composition.

7. The encapsulation composition of claim 6, wherein the one or more base oligomer/polymers comprises in the range of about 20 to about 50 weight percent of the composition.

8. The encapsulation composition of claim 1, wherein the one or more diacrylate monomers comprise in the range of about 1 to about 50 weight percent of the composition.

9. The encapsulation composition of claim 8, wherein the one or more diacrylate monomers comprise in the range of about 10 to about 30 weight percent of the composition.

10. The encapsulation composition of claim 1, wherein the thixotropic agent comprises in the range of about 0.1 to about 8 weight percent of the composition.

11. The encapsulation composition of claim 10, wherein the thixotropic agent comprises in the range of about 2 to about 5 weight percent of the composition.

12. The encapsulation composition of claim 1, wherein the one or more filler materials comprise in the range of about 1 to about 85 weight percent of the composition.

13. The encapsulation composition of claim 12, wherein the one or more filler materials comprise in the range of about 50 to about 75 weight percent of the composition.

14. A method of providing encapsulation on an electronic component comprising the step of applying the composition of claim 1 to an electronic component.

\* \* \* \* \*